United States Patent [19]

Kadlec et al.

[11] Patent Number: 5,234,560
[45] Date of Patent: Aug. 10, 1993

[54] METHOD AND DEVICE FOR SPUTTERING OF FILMS

[75] Inventors: Stanislav Kadlec, Prague; Jindrich Musil, Revnice, both of Czechoslovakia

[73] Assignee: Hauzer Holdings BV, Netherlands

[21] Appl. No.: 870,734

[22] Filed: Apr. 16, 1992

Related U.S. Application Data

[63] Continuation of Ser. No. 566,681, Aug. 13, 1990, abandoned.

[30] Foreign Application Priority Data

Aug. 14, 1989 [CS] Czechoslovakia ............... 4804-89

[51] Int. Cl.$^5$ ............................................. C23C 14/35
[52] U.S. Cl. ......................... 204/192.12; 204/192.16; 204/298.05; 204/298.06; 204/298.16; 204/298.19; 427/523; 427/524
[58] Field of Search ............... 204/192.12, 192.16, 204/192.3, 298..05, 298.06, 298.16, 298.17, 298.19; 427/523, 524

[56] References Cited

U.S. PATENT DOCUMENTS

| | | | |
|---|---|---|---|
| 2,146,025 | 2/1939 | Penning | 204/192.12 |
| 3,616,450 | 10/1971 | Clarke | 204/298.17 |
| 3,878,085 | 4/1975 | Corbani | 204/298.19 |
| 4,116,791 | 9/1978 | Zega | 204/192.31 |
| 4,166,018 | 8/1979 | Chapin | 204/192.12 |
| 4,197,175 | 4/1980 | Moll et al. | 204/192.38 |
| 4,426,267 | 1/1984 | Münz et al. | 204/192.12 |
| 4,588,490 | 5/1986 | Cuomo et al. | 204/298.06 |
| 4,990,229 | 2/1991 | Campbell et al. | 204/298.06 |
| 5,022,978 | 6/1991 | Hensel et al. | 204/298.19 |

FOREIGN PATENT DOCUMENTS

| | | | |
|---|---|---|---|
| PV-8659 | of 0000 | Czechoslovakia . | |
| 2583250 | of 0000 | France . | |
| 61-190070 | 8/1986 | Japan | 204/298.16 |
| 62-147733 | 7/1987 | Japan | 156/345 |

OTHER PUBLICATIONS

J. L. Vossen and W. Kern, "Thin Film Processes", Academic Press, New York, 1978 (131–173).
B. Window and N. Savvides, *J. Vac. Sci. Technol.*, A4 (2), Mar./Apr., 1986 (196–202).
R. Limpaecher and K. R. MacKenzie, *Rev. Sci. Instrum.*, vol. 44, No. 6, Jun., 1973 (726–731).
Y. Arnal et al., *App. Phys. Lett.*, Jul. 15, 1984 (132–134).

*Primary Examiner*—Aaron Weisstuch
*Attorney, Agent, or Firm*—Townsend and Townsend Khourie and Crew

[57] ABSTRACT

A method and apparatus for controlling thin layer sputtering, especially titanium-nitride-type hard, abrasion-proof layers. Ionization current on substrates, especially at greater distances from cathode, is increased and layers are more homogenous. Density and homogeneity of both ionization and electron current on substrates are increased and ionic cladding during layer sputtering and with floating potential of substrates is possible. Substrates are placed in a holding space defined by lines of force of a magnetic multipolar field that includes a closed tunnel of magnetron-type lines of force above the sputtered cathode and whose direction on the boundary of the holding space alternates from positive to negative polarity and vice versa. In the holding space, interaction of the glow discharge with the magnetic multipolar field forms a homogenous plasma whose particles bombard the substrates. The degree of plasma holding is controlled by the shape of the magnetic field and by the voltage on an auxiliary cathode which passes through the holding space. The present invention includes sources of magnetic field placed around the holding space with alterating polarity. In order to control the degree of plasma holding, electromagnets, a sliding anode extension piece, or an auxiliary electrode can be included.

21 Claims, 5 Drawing Sheets

METHOD AND DEVICE FOR SPUTTERING OF FILMS

This is a Continuation of application Ser. No. 07/566,681 filed Aug. 13, 1990, now abandoned.

BACKGROUND OF THE INVENTION

The present invention concerns a method and device for the sputtering onto substrates of a layer of particles sputtered from a cathode surface using gas glow discharge and which provides for the formation of a dense homogenous plasma over a large volume, making possible the sputtering of layers onto substrates when the substrates are placed at distances of 100 to 500 mm from the cathode.

Coating thin layers by cathode sputtering is a well-known process. Usually, cathode sputtering is preferred over other methods of coating layers, such as vacuum evaporation, in that cathode sputtering offers high reproducibility, layer coating in arbitrary directions, such as from top to bottom, and allows mixture and alloy compositions from a sputtered cathode to be transformed into layer form, etc. However, classic diode sputtering is inefficient and time consuming, due to the high gas pressures necessary for maintaining a glow discharge. Consequently, methods and means utilizing a magnetic field for reduction of working pressure during sputtering have been proposed. These systems are based on U.S. Pat. No. 2,146,025 issued to Penning (1939). Another solution was proposed in U.S. Pat. No. 3,616,450 issued to P. Clarke (1971). In accordance with that patent, the path of electrons in a sputtering device is elongated by a cylindrical hollow anode placed in an axial magnetic field and by a sputtering cathode formed in the shape of a hollow cylinder, accommodated coaxially with the anode, outside the magnetic field. However, a more successful solution was magnetron discharge in accordance with U.S. Pat. No. 3,878,085 issued to J. Corbani (1975) and U.S. Pat. No. 4,166,018 issued to J. S. Chapin (1979). In accordance with those patents a closed tunnel of magnetic field lines of force is formed, the path of electrons in this tunnel is elongated, ionization is increased, and sputtering is accelerated. See also, J. L. Vossen and W. Kern, *Thin Film Processes*, pp. 76-140 (Academic Press, New York, 1978).

In practice, it is sometimes necessary during layer sputtering that when material is condensing on the substrate, at the same time the substrate must also be bombarded with charged particles of suitable energy, such as positive ions. This method of coating is called ion plating. Before being used with sputtering, ion plating was used with vacuum evaporation. An example is evaporating with an electronic beam in accordance with U.S. Pat. No. 4,197,175 issued to Moll et al. (1980). Ion plating during magnetron sputtering is well-known from U.S. Pat. No. 4,116,791 issued to Bizega (1978). A substrate is placed on an electrode which is supplied with a negative voltage relative to the vacuum chamber, while a magnetron cathode is placed opposite the substrate and is also supplied with a negative voltage relative to the vacuum chamber. The biased electrode with substrates thereon attracts ions from the magnetron discharge, and thus ion plating occurs. In accordance with U.S. Pat. No. 4,426,267 issued to W. Münz et al. (1984), a method and device for coating three-dimensional bodies are provided. In accordance with that method, bodies intended for coating move between two magnetron cathodes having a common glow discharge, in the space between them. It is possible to supply the substrates with negative bias for ion plating.

One drawback of the above-mentioned methods of ion plating during magnetron sputtering is that the ionization current extracted by the biased substrates quickly drops as the distance between the substrate and the magnetron cathode increases. Typically, when the distance between the substrate and the cathode is 20 to 50 mm, the ionization current is too low for successful ion plating. Furthermore, the plasma between the pair of cathodes cannot be sustained if the cathodes are separated by large distances, thus making it impossible to use the above-mentioned methods for ion plating remote or large objects. It is possible to increase the plasma density at greater distances from a magnetron cathode however. One way to do this is by means of arc discharge in a hollow cathode, from which electrons are extracted for plasma ionization. This system is disclosed in U.S. Pat. No. 4,588,490 to J. J. Cuomo (1986). However, such a solution is complicated and expensive.

A certain increase of the charged particles' current on substrates is observed with a planar magnetron of the "unbalanced" type; see B. Window and N. Savvides, *J. Vac. Sci. Technol.*, A4:196–202 (1986). In this type of magnetron, some magnetic field force lines which radiate from the periphery of the sputtered cathode approach each other and at greater distances recede from each other. Substrates placed in a magnetic field above the cathode are subjected to a greater bombardment by charged particles than with the classic "balanced" magnetron.

It is possible to attain higher ionization currents on substrates than is possible with unbalanced magnetrons by application of a double-sided discharge in accordance with Czechoslovakian author's certificate No. PV 8659-88 of S. Kadlec, J. Musil and W. D. Münz. In this device, there is formed an intense magnetic field between the cathode and the substrates, and the discharge between the cathode, substrate and anode is maintained by processes on the cathode and on the substrates. High induction of the magnetic field concentrated in the space between the cathode and substrates guarantees maintenance of a dense plasma and guarantees that the density of ionization current flowing on the substrates does not drop with increasing cathode distances up to about 200 mm.

A drawback of unbalanced magnetron and double-sided discharge is that the plasma and density of ionization current on the substrates are not sufficiently homogenous across the magnetic field's lines of force. In addition, substrates are inevitably placed directly in the magnetic field and this field is therefore affected by the magnetic properties of substrates. Consequently, it is practically impossible to use the same device for both weak magnetic and ferromagnetic substrates.

It is well known from plasma physics that a relatively dense and homogenous plasma can be maintained using a multipolar magnetic field. See, for example, R. Limpaecher and K. R. Mac Kennzie, Rev. Sci. Instrum. 44:726 (1973). Plasma is generated in such a system by emission of electrons from glowing cathodes and at the same time the plasma is maintained by a multipolar magnetic field formed by permanent magnets placed around the whole chamber oriented with alternating polarity. The purpose is to produce a steady plasma with high spatial homogeneity in the central part thereof where the magnetic field is very low.

Besides plasma generation by emission of electrons there is a well-known method of plasma generation by absorption of microwaves to decompose gases such as $SF_6$, and use of the decomposition products to etch substrates. French patent No. 25-83-250 (1986) issued to Y. Arnal, J. Pelletier, and M. Pichot discloses methods and devices which teach how to combine such a microwave-generated discharge and multipolar containment, or "holding" to provide a more homogenous and denser plasma, so as to increase the homogeneity of the plasma-produced reactive gas, and provide a more homogenous generation of radicals and therefore an increase of etching homogeneity and anisotropy, as stated in the work of Y. Arnal, et al., *Appl. Phys. Lett.*. 45:132 (1984). However the purpose of multipolar holding as used in the above-mentioned cases is different than for maintaining plasma for ion plating during sputter deposition, where a direct-current glow discharge occurs between anode and sputtered cathode.

SUMMARY OF THE INVENTION

The present invention provides a method of layer sputtering on substrates by particles sputtered from a cathode surface during glow discharge between the cathode and an anode in a gas or gas mixture under reduced pressure in a vacuum chamber also containing substrates, with a holding space defined by a magnetic field and closed tunnel of magnetron-type magnetic field lines of force formed above the cathode. The substance of the invention consists in that the holding space containing the substrates, outside of which are placed the anode and the walls of the vacuum chamber, is bounded by a multipolar magnetic field's lines of force, while the multipolar magnetic field contains a closed tunnel of magnetron-type magnetic field lines of force, and its direction changes at the boundary of the holding space from a positive polarity into a negative one and vice versa. In the volume of the holding space, magnetic field induction is reduced and, due to interaction of the holding field and glow discharge between cathode and anode, a plasma is formed and maintained in the holding space, and the plasma particles bombard substrates and layers.

There are several ways to vary the degree to which the plasma is held in the holding space: by changing the intensity and/or the form of the holding multipolar magnetic field with respect to the anode, the chamber walls, and/or the cathode. These variations change the plasma's density around the substrates and change the energy of the plasma's charged particles. Variation can also be effected by varying the polarity and voltage intensity between the anode and an auxiliary electrode placed in the holding space. There are also several ways to control bombardment of substrates by charged particles: by controlling the potential of the surface of the substrates or of layers growing on the substrates relative to the anode, or by allowing the potential of the substrates or growing layers to float. Due to the difference between the plasma potential and the floating potential, the substrates or layers are bombarded by charged particles, the energy and density of which is controlled by the plasma's holding degree, gas pressure and sputtering discharge output.

A device for carrying out the above-mentioned method comprises a vacuum chamber, in which the cathode of the sputtering source is accommodated, a substrate holder and an anode. In the wall of the vacuum chamber there are means for supply of working gas and for pumping out used gasses. Outside the vacuum chamber, there is a direct-current or high-frequency voltage source, connected between cathode and anode, and magnetic field sources. The substance of the invention is that sources of the magnetic field for forming and maintaining the multipolar magnetic field are placed around the whole holding space containing substrates so that groups of magnetic field sources which have like poles in one direction alternate with adjacent groups of magnetic field sources which have like poles in the opposite direction. The sources of the magnetic field may be placed in one or more locations inside the chamber, in the chamber wall, outside the chamber, or behind the cathode and groups of sources placed behind the cathode are arranged in concentric closed curves for forming at least one closed tunnel of magnetic lines of force above the cathode's surface.

The substrate holder and the anode are electrically connected either by a direct current or high-frequency voltage source, $U_E$, or by a variable resistor, R, which is selectable from zero resistance to infinite resistance. In order to enable changing of the anode's position with regard to the magnetic field, the device is equipped with a sliding anode extension piece made of conductive material, electrically connected with the anode. It is also possible to change the plasma's holding degree so that at least one auxiliary electrode is accommodated in the holding space and outside the chamber is accommodated a direct-current voltage source $U_E$, with one pole connected to the auxiliary electrode and with the other pole connected to the anode.

The present invention teaches the creation of dense and homogenous plasmas on substrates during layer sputtering. It is also possible to attain ion plated layers on substrates, positioned at various distances from the cathode, usually 30 to 500 mm. Densities of ionic current on the substrates usually attain values of 0.1 to 10 $mA/cm^2$ with current density on the cathode of 2 to 50 $mA/cm^2$ obtainable even with a cathode-substrate separation of 200 mm or more. At the same time, it is possible to attain such a plasma spatial homogeneity that ionization current is constant within a tolerance $\pm 10\%$ with a typical length of 100 to 200 mm, i.e. distance from cathode of from 100 to 250 mm. Such a homogenous ionic bombardment enables the formation of layers such that layers have the desired properties over the entire surface of the substrate even when the substrate is a three-dimensional body. For example, it is possible to form compact titanium nitride layers having microhardnesses from 2,000 $kg/mm^2$ to 2,600 $kg/mm^2$, where texture, stress, etc., can be controlled by varying the bias level on the substrates, typically from $-20$ to $-150$ V. It is possible to create compact titanium nitride layers without an external substrate bias source, by regulating the plasma's holding degree to create a floating potential of, for example, $-20$ to $-45$ V. In such a way it is possible to control layer texture from (200) to (111), while stress in these layers is low, from 2 to 3 GPa. One advantage of the method and device is that they allow for a wide range of operating pressures, especially at low pressures down to $2 \times 10^{-2}$ Pa.

A further advantage is the possibility of coating non-conductive layers by means of direct-current sputtering or coating layers on non-conductive substrates with the use of floating substrate potential. The device's primary advantage is that substrates are placed in the space where the magnetic field is weak and therefore it is possible to coat both magnetic and non-magnetic substrates using the same device.

DESCRIPTION OF THE PREFERRED EMBODIMENTS

Figure 1A:
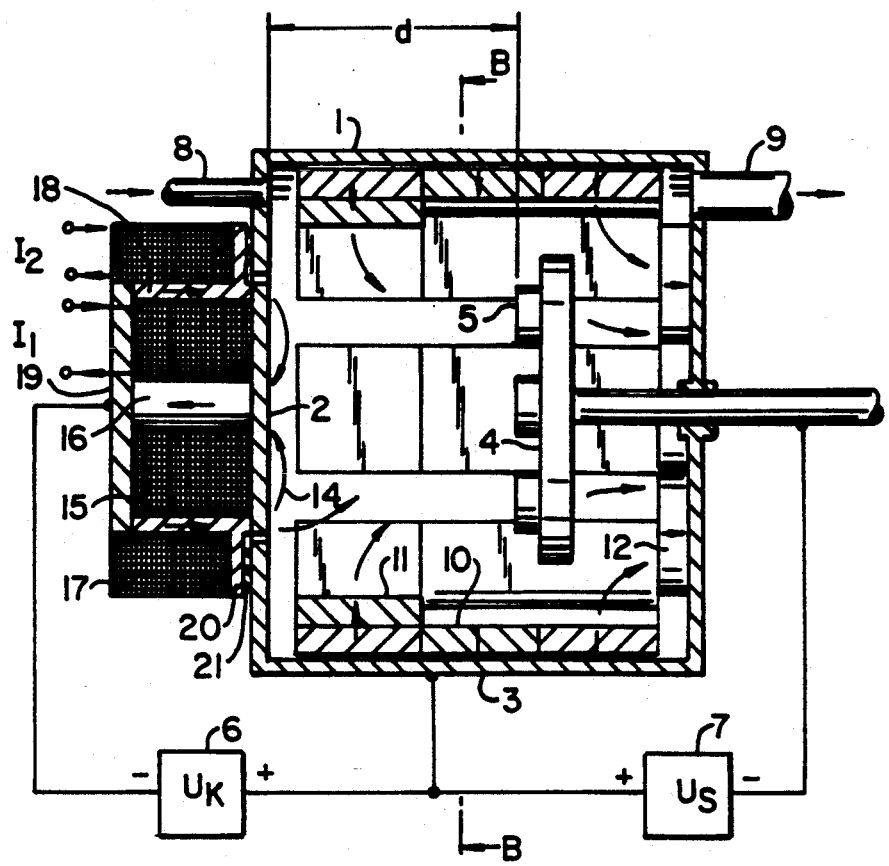
FIG. 1A is a longitudinal sectional view taken along lines A—A of FIG. 1B illustrating a first embodiment of the invention.
Figure 1B:
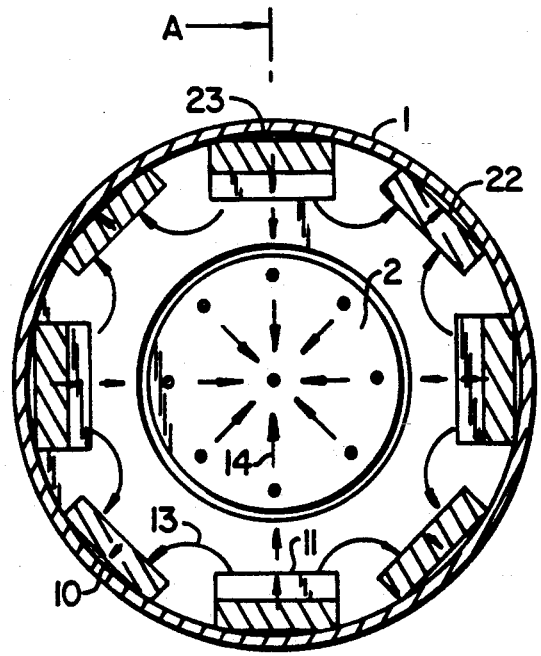
FIG. 1B is a sectional view taken along lines B—B of FIG. 1A.

FIG. 1 schematically represents a device equipped with two electromagnets behind a circular cathode. The device consists of chamber 1, which is a vacuum chamber made of a magnetically soft metal and is cylindrical in shape, with its axis oriented horizontally. Chamber 1 also serves as anode 3. Chamber 1 is equipped with inlet 8 which provides working gas and pumping outlet 9. Flush with one vertical wall of chamber 1 and coaxial with it, is a flat circular cathode 2 made of titanium. Circular holder 4 of substrates 5 is fastened coaxial to chamber 1 and opposite cathode 2; holder 4 is adjustably fastened such that the distance between holder 4 and cathode 2 can be varied from 30 to 300 mm. Source 6 of cathode voltage $U_K$ and source 7 of substrate voltage $U_S$ are placed outside chamber 1. Source 6 of voltage $U_K$ is a source of direct-current voltage from zero to 1,000 V and is connected with its negative pole to cathode 2 and its positive pole to chamber 1. Source 7 of direct-current voltage $U_S$, variable from zero to 1,000 V, is connected with its negative pole to conductive holder 4 and its positive pole to chamber 1. Sources of the multipolar magnetic holding field are, in part, permanent magnets 10, 11, 12, and, in part, two electromagnets 15, 17.

As see in FIGS. 1A, permanent magnets 10, 11 are accommodated and fastened on the inner surface of chamber 1 in groups 22, 23 which form an even number of rows, eight are shown in FIG. 1A, parallel with the device's axis. All the magnets in a given group have congruent orientations and have radial directions. The magnets of adjacent groups 22, 23 have opposite polarity orientations. For this purpose, magnets 11 closer to cathode 2 are doubled in one orientation. Permanent magnets 12 are further accommodated on the chamber's inside vertical wall behind the substrates and their poles are oriented parallel with the device's axis and their field is connected with the fields of magnets in groups 22, 23 on the inner surface of chamber 1.

The device is further equipped with two electromagnets for forming a holding magnetic field. The first electromagnet consists of coil 15, connected across current source $I_1$, placed behind cathode 1 and coaxially with it, and of core 16 made of soft steel, which is inserted into the central cavity of the first coil 15. The second electromagnet consists of the second coil 17, connected across current source $I_2$, which is placed behind cathode 1 and coaxially with it around the first coil 15. Hollow core 18, made of soft steel in the shape of a cylindrical annulus, fills the space between the first and the second coil and is connected across plate 19, made of soft steel, with core 16. The whole assembly of cathode 2, the first and the second coil 15 and 17 and magnetic circuit 16, 18, 19 are attached across packing and insulating ring 21 by aid of flange 20 on the edge of the circular cut-out in the vertical wall of chamber 1. For clarity, several components are not shown, such as: the sources of currents $I_1$ and $I_2$, the gas filling and pumping systems, packing, insulation, vacuum gauges, means for cooling the cathode, chamber and substrates, and means for heating the substrates. If the process of layer sputtering requires it, the device can also include a movable shutter between the cathode and substrates.

The device functions as follows: Chamber 1 is filled through inlet 8 with a working gas or gas mixture, such as a mixture of argon and nitrogen, to a required overall pressure, $p_T$. A glow discharge is then ignited between cathode 2 and chamber 1, which also serves as anode 3. This discharge is conditional and is influenced by the multipolar magnetic holding field lines of force 13, 14 which enclose the holding space where substrates 5 and holder 4 are accommodated. The lines of force of the multipolar field on the boundary of the holding space change direction at various locations owing to the alternating polarities of magnet groups 22, 23. Therefore, moving from the edge of the holding space, to the center, the magnetic field intensity drops quickly. This field pattern applies magnetic pressure to the plasma from the edges toward the center of the holding space, thereby confining a dense plasma.

Magnetic induction on the boundary of the holding space is usually 10 mT to 50 mT or even more; in the middle region containing the substrates, it usually ranges from zero to 2 mT. For perfect plasma holding, it is necessary that from the middle region of the holding space to the anode no channel runs with a lower than minimum magnitude of magnetic induction, which is usually from 1 to 10 mT. If such a channel exists, holding is only partial and the density of the plasma is reduced. Also, the discharge stability may be reduced as further described in conjunction with FIG. 4.

A part of the multipolar magnetic holding field is the magnetic field above cathode 2, formed by coils 15 and 16 and magnetic circuit 16, 18, 19, placed behind cathode 2. Current $I_1$ of coil 15 forms a closed tunnel of lines of force 14 above the cathode and current $I_2$ of second coil 17 forms a magnetic field, with lines of force emerging from the edge of cathode 2 and connecting with lines of force formed by permanent magnets 11. It is possible to change the shape and intensity of the magnetic field formed by coils 15 and 17 by changing the polarity and magnitude of currents $I_1$ and $I_2$, thereby affecting the plasma's holding, as seen from FIG. 4.

Therefore, a dense plasma results from interaction of the glow discharge between cathode 2 and anode 3 with the multipolar magnetic holding field and is maintained in the holding space. Particles from this plasma, especially electrons and positive ions, impinge on the substrates and can affect the properties of growing layers. If the substrates are electrically conductive, it is possible to apply a voltage $U_S$ from source 7 to them and thereby change the kind and energy of bombarding particles, and also change further conditions of the layers' growth. A voltage $U_S$ from $-20$ to $-100$ V is usually sufficient during layer deposition to achieve such effects. In the case of a higher voltage $U_S$, usually from at least $-200$ to $-1,000$ V, it is possible to attain ionic etching of substrates 5.

It is also possible to affect properties of layers by changing the distance between the cathode and the substrates. It was found that in a device in accordance with FIG. 1 that during titanium sputtering in argon with $p_T=0.1$ Pa and with constant cathode discharge, the ionization current $I_s$ owing onto substrates with a bias of $U_S = -100$ V varied only $\pm 10\%$ from its mean value, over cathode-substrate separations ranging from 80 to 220 mm. It is an important advantage of the present method and device, confirming high homogeneity of plasma in the holding space, and can be utilized for affecting properties of layers.

Figure 2:
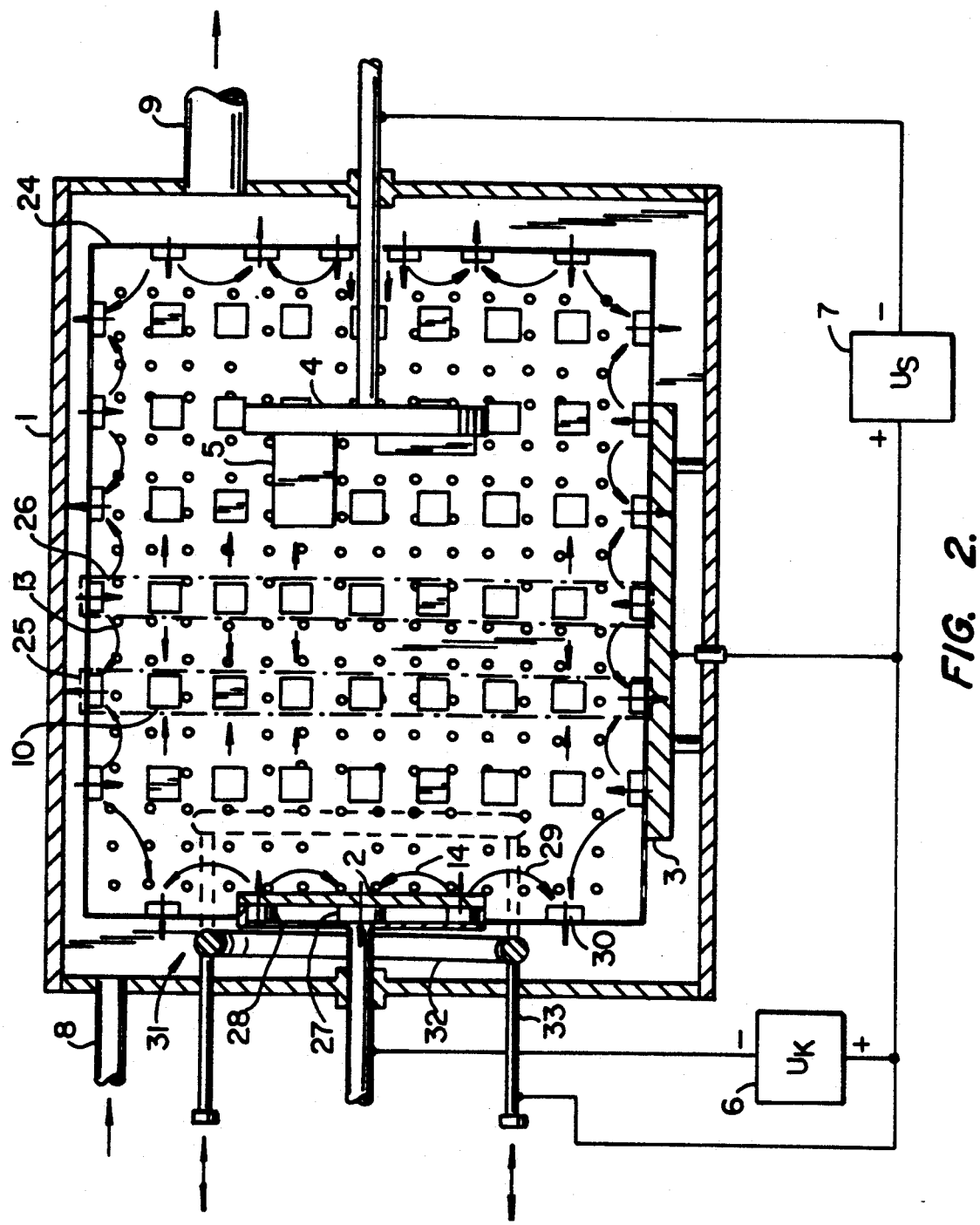
FIG. 2 is a longitudinal sectional view similar to FIG. 1A illustrating an alternative embodiment of the invention having a rectangular cathode and an anode extension piece.

FIG. 2 schematically represents a device equipped with one rectangular cathode and an anode extension piece. Vacuum chamber 1, equipped with inlet 8 for working gas and pumping output 9, has a parallelepiped shape. At the lower wall of chamber 1 and parallel with it, is provided an insulated anode 3, a quadrangular plate made of conductive material. Cathode 2 is placed parallel with one vertical wall of chamber 1 and has a rectangular shape. Opposite cathode 2, and parallel with it, is a flat holder 4 of substrates 5. Cathode voltage source 6, $U_K$, and substrates voltage source 7, $U_S$, are provided outside chamber 1. Sources of the multipolar magnetic holding field are formed by permanent magnets 10 which are partly attached around the holding space on a perforated magnet carrier 24, connected electrically with anode 3, and assembled in groups 25, 26, 30, accommodated in planes parallel with the plane of cathode 2. In these groups 25, 26, 30, all magnets are oriented either toward the chamber or in the opposite direction, while adjacent groups 25, 26 are oriented opposite one another.

Permanent magnets are further placed behind cathode 2 in two groups 27, 28. The first group, 27 has a rectangular base and is placed behind the middle part of cathode 2 and the second group 28 is placed behind the perimeter of cathode 2. The orientations of magnets in both groups 27, 28 are mutually opposite, and lines of force 29 of the magnetic field in the second group of magnets 28 are connected with the lines of force in the nearest group 30 of magnets placed on magnet carrier 24. The device is further equipped with movable anode extension piece 31, which is electrically connected to anode 3. Extension piece 31 consists of a rectangular frame 32, with dimensions greater than the dimensions of cathode 2, and of pistons 33, which pass through the wall of chamber 1 behind cathode 2. It is possible to displace extension piece 31 by aid of pistons 33 across lines of force 29 of the magnetic field around cathode 2 into various positions, keeping the plane of frame 32 parallel with the plane of cathode 2. Because of its construction, frame 32 can be behind, before, or even with the plane of cathode 2. For clarity, similar elements are not shown in FIG. 2, in contrast to FIG. 1. Means for cooling anode extension piece 31, anode 3, and magnet carrier 24 are not shown here.

The device in accordance with FIG. 2 functions analogously to the device shown in FIG. 1. However, the magnetic holding field in FIG. 2 is fixed by the layout of permanent magnets 10 used for forming magnet field 14, 29 above cathode. Control of the plasma's holding degree in the holding field can be carried out in this device by movement of anode extension piece 31 across the boundary of the holding space around cathode 2, which would also cross lines of force 29. The highest degree of plasma holding is attained by shifting extension piece 31 out from the holding space and placing it behind the plane of cathode 2. Insertion of extension piece 31 toward the holding space, i.e., into regions of lower magnetic induction causes more electrons and ions from the holding space to impinge on anode extension piece 31, where they recombine, resulting in decreased plasma density in the whole holding space, and thus also increasing the plasma density around substrates 5. In such manner, it is possible to regulate the intensity of the bombardment of substrates 5 by particles from the plasma, and thereby regulate the properties of growing layers. Movement of anode extension piece 31, in effect, changes the anode's position with respect to the magnetic field.

It is possible to affect characteristics of the charged particles, such as their number and energy, which bombard the substrates, by holding the substrates' surface at a chosen potential. It is possible to use source 7 of either direct-current or high-frequency voltage $U_S$ for biasing conducting substrates and conducting layers. It is necessary to use a source 7 of high-frequency voltage $U_S$ in the case of nonconducting substrates and/or nonconducting layers. However, if source $U_S$ is disconnected, substrates with growing layers are at floating potential and because of the difference between the plasma potential and the floating potential, growing layers are bombarded by accelerated positive ions and, at the same time, by electrons in the same quantity. It is possible to affect the magnitude of the floating potential and plasma density, which defines the flux density of bombarding particles, firstly by the degree of plasma holding, e.g. by movement of anode extension piece 31, by the magnitude of the gas pressure, and, if need be, by regulating the power of the sputtering discharge by changing the distance between the substrate holders and cathode 2. This method which uses the floating potential of the substrates, has first and foremost the advantage that it is equally suitable for nonconducting and conducting substrates and for conducting and nonconducting layers.

Figure 3A:
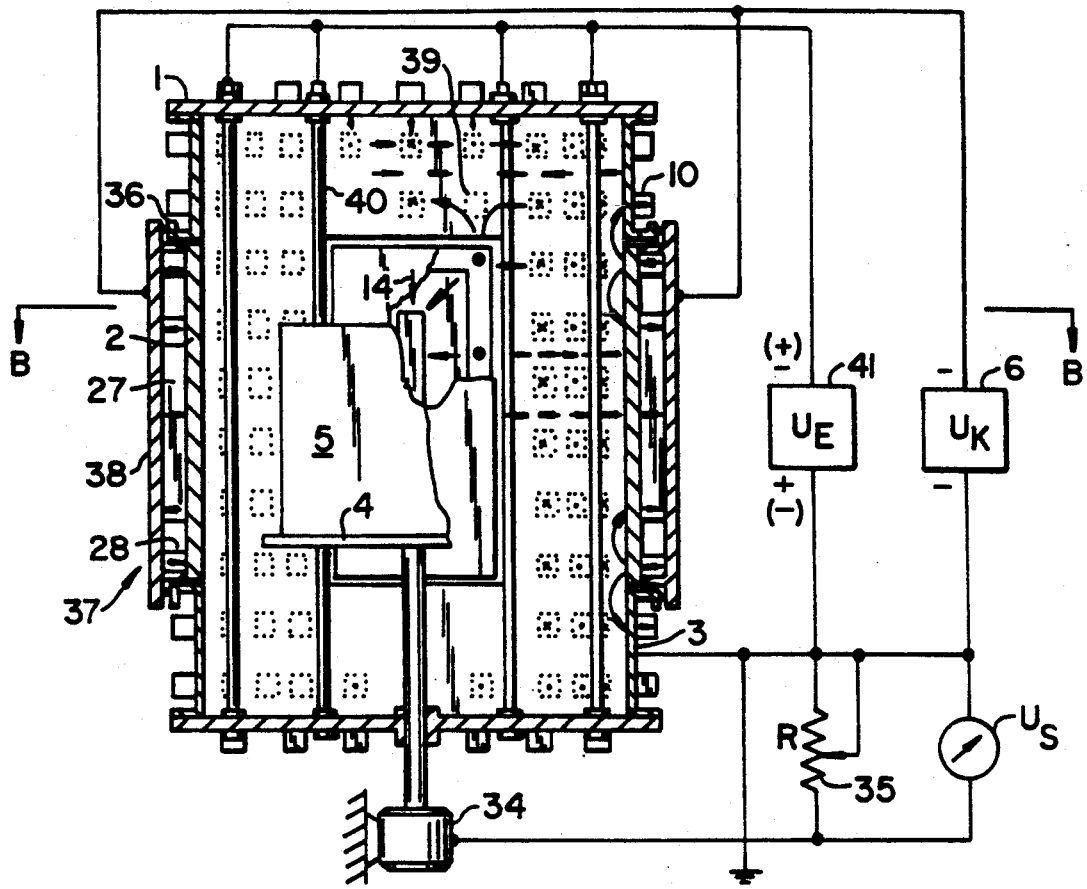
FIGS. 3A and 3B are views similar to FIGS. 1A and 1B illustrating another embodiment of the invention having four cathodes and auxiliary electrodes.
Figure 3B:
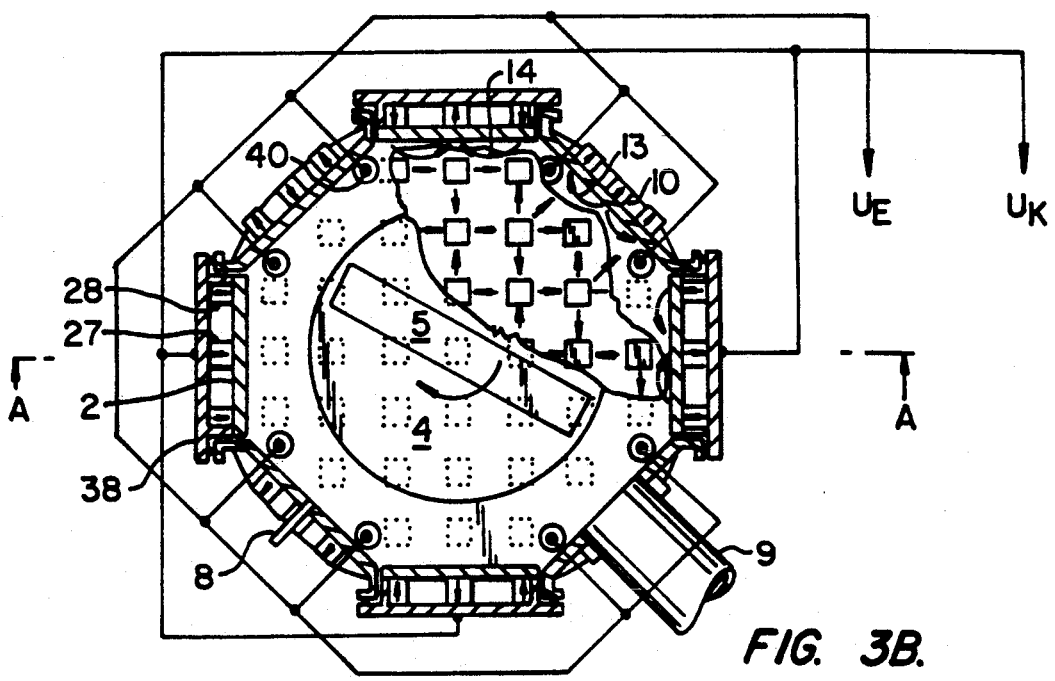

FIGS. 3A and 3B represent devices equipped with four cathodes and auxiliary electrodes. Chamber I of the device has the shape of an octagon with a vertical axis, is made of nonmagnetic conducting material, such as nonmagnetic stainless steel, and also serves as anode 3. Along the axis of chamber 1 there is accommodated from below a circular holder 4 of substrates 5, which can rotate by means of motor 34, placed under the chamber's bottom. A resistor 35 is connected between substrate holder 4 and chamber 1, resistor 35 being adjustable from zero to infinite resistance. In the four vertical walls of chamber 1, four rectangular cathode assemblies 37 at 90 degree intervals are fixed by flanges 36. Each cathode assembly 37 consists of rectangular cathode 2, magnetically conducting rear plate 38 and permanent magnets 10, arranged in two groups 27, 28, the first of which, group 27, is placed behind the cathode's center and the second, group 28, behind its circumference, by analogy with a device in accordance with FIG. 2. Besides the magnets in cathode assemblies 37, sources of the multipolar magnetic holding field are permanent magnets 10, placed outside chamber 1, in nearly regular fashion on chamber 1, in groups forming vertical rows of similarly oriented magnets and oriented oppositely with respect to adjacent rows. Magnets 10 are accommodated on the exterior wall bases of chamber 1 and oriented in a checkered arrangement. The magnetic field of the magnets at the chamber edges is connected with the magnetic field at the chamber's bases. At the same time, the positions 39 on the inner chamber wall around cathode 2, where in the case of a regular arrangement of magnets 10 there should be placed magnets equally oriented with respect to the second group 28 of magnets behind the cathode 2, are left vacant. The device is further equipped with eight auxiliary electrodes 40, the surfaces of which are advantageously formed of material of cathode 2. These auxiliary electrodes 40 pass through holding space parallel with the axis of chamber 1, while two are always placed near one cathode 2, at opposite edges of each cathode 2. All electrodes 40 are insulatingly led out through the base of chamber 1 to source 41 of voltage $U_E$, placed outside the chamber, which supplies direct-current voltage, e.g. in range −200 to 200 V with respect to chamber 1. For clarity FIG. 3 does not show similar elements as do FIGS. 1 and 2. For use at higher power, it is necessary to provide cooling of auxiliary electrodes 40, which are also not shown in FIG. 3.

A function of a device in accordance with FIG. 3 can be analogized to the function of devices according to FIGS. 1 and 2. However, in a device in accordance with FIG. 3, the substrates can rotate on holder 4 by means of motor 34. At the same time, four cathodes are sputtered so that layers on substrates grow from all sides simultaneously. The holder 4 of substrates 5 is electrically connected across anode 3 via resistor 35. With R having infinite resistance, substrates are held at floating potential; with R having zero resistance, holder 4 is held at the anode's potential. The resistance of resistor 35 can consequently change the substrates' bias and the current that flows onto them. The degree of plasma holding in the holding space is affected by the polarity and magnitude of $U_E$ on auxiliary electrodes 40. A sufficiently high negative voltage with respect to anode 3, e.g. in the range from −20 to −200 V, or higher if need be, is fed to electrodes 40. Electrons from the plasma are repelled by the negative bias of auxiliary electrodes 40 and the degree of plasma holding is high. By changing the voltage $U_E$ on electrodes 40 gradually to a positive voltage, e.g. from value of −20 V to a value of +50 V, electrodes 40 act as anodes, i.e. plasma on electrodes 40 recombines and the degree of plasma holding in holding space is thereby reduced. Therefore, the plasma's density around the substrates is reduced and consequently it is possible to affect the quantity of charged particles impinging on substrates.

An important advantage of the device in accordance with FIG. 3 is that uniform rate of layer coating on substrates is attained practically from all directions due to the regular layout of large-size cathodes 2 around substrates 5 and due to rotation of holder 4. This, together with the plasma's homogeneity around the substrates, guaranteed by the multipolar magnetic plasma holding, allows for the creation of homogeneously coated layers on all substrate surfaces. This advantage is very important, especially for layers whose properties strongly depend on deposition rate, energy and density of impinging particles, such as titanium nitride layers needing specific stress and of crystallite orientation characteristics.

Figure 4A:
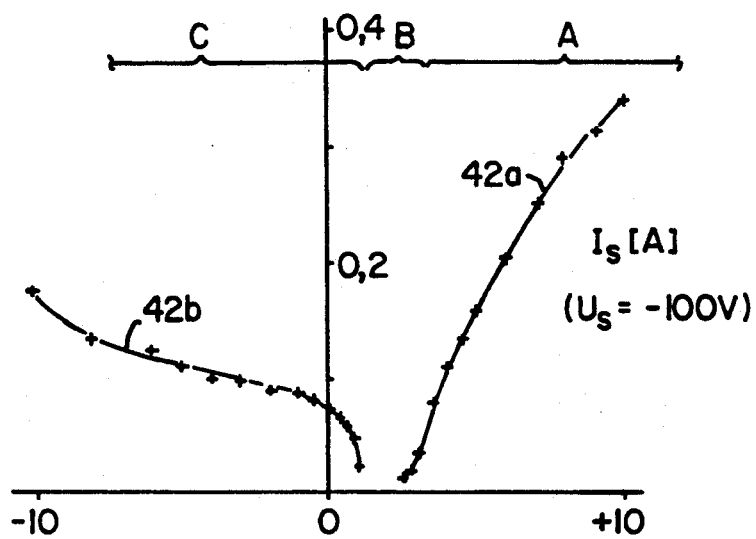
FIGS. 4A–4C are graphs showing certain operating characteristics of the invention.
Figure 4B:
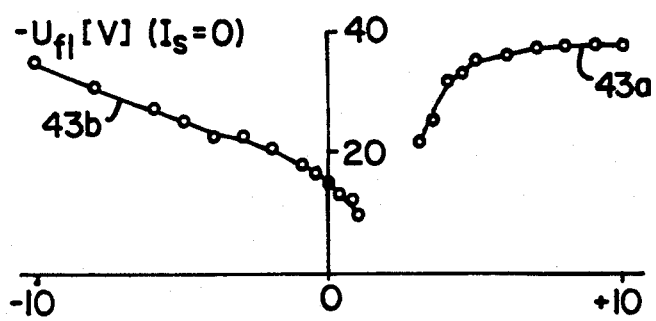
Figure 4C:
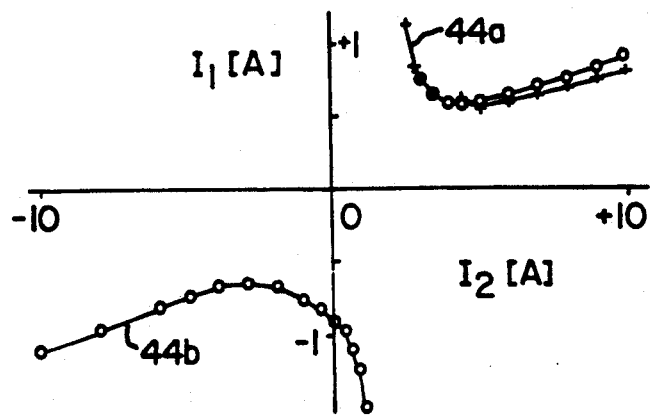

FIG. 4A is a graph of the $I_S$ (ionization current) vs. $I_2$ characteristic 42a,b in a device according to FIG. 1 with substrate bias $U_S=100$ V. FIG. 4B is a graph of the $U_{fl}$ (substrate floating potential) vs. $I_2$ characteristic 43a,b with current $I_s=0$ A. FIG. 4C is a graph of the $I_1$ vs. $I_2$ characteristic 44a,b. The following parameters were held constant during the measurement of characteristics 42a,b; 43a,b; and 44a,b: cathode-substrate separation $=200$ mm, argon gas pressure $(p_T)=0.1$ Pa, cathode voltage $(U_K)=-600$ V, cathode current $(I_K)=1$ A.

Figure 5:
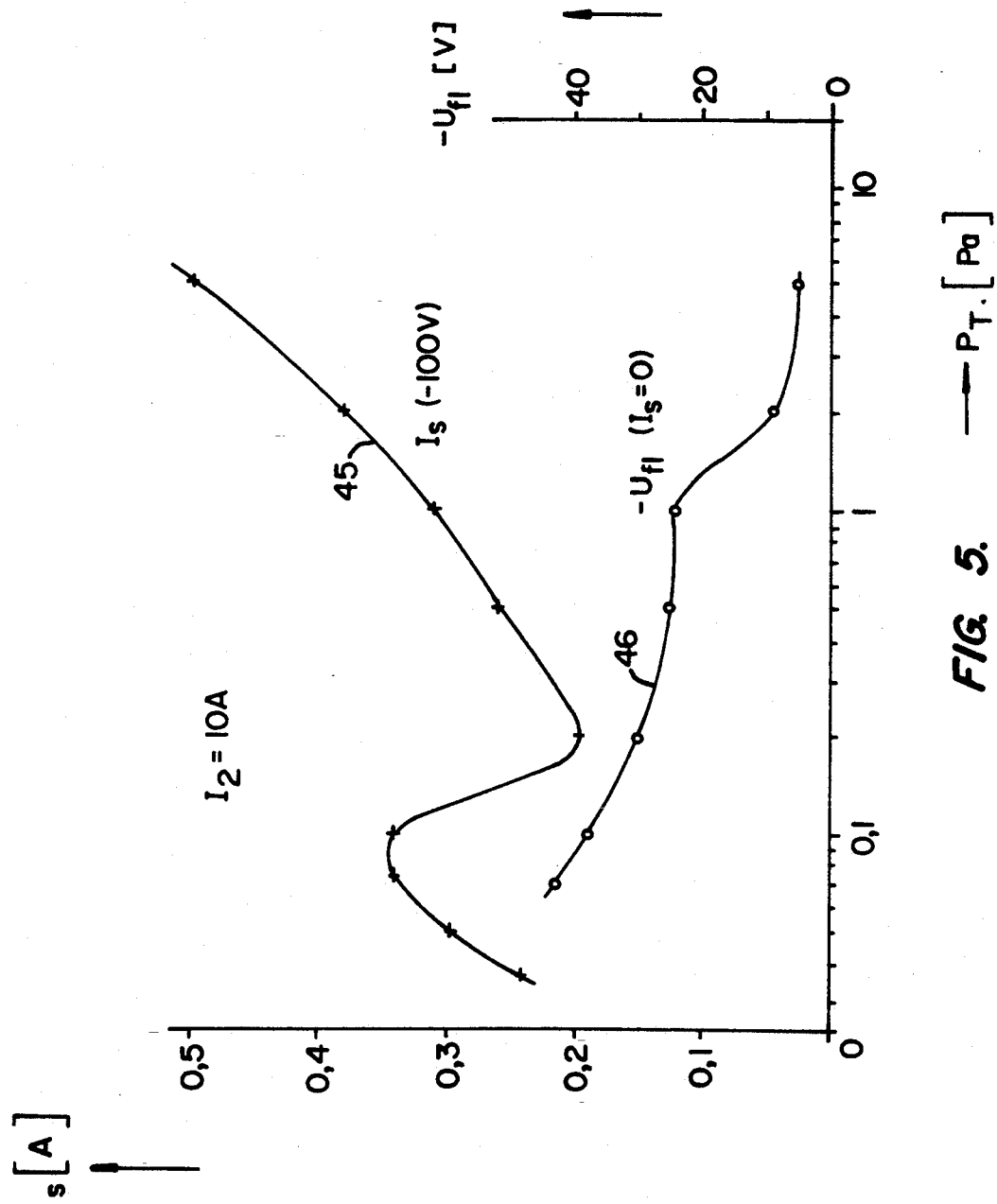
FIG. 5 is a graph of ionization current and floating potential vs. overall pressure.

FIG. 5 shows the $I_s$ vs. $p_T$ characteristic 45 in a device according to FIG. 1, with the substrate voltage $U_S=-100$ V. It also shows $U_{fl}$ vs. $p_T$ characteristic 46, with $I_S=0$ A. Both characteristics 45, 46 were measured with the same constant parameters: cathode-substrate separation (d)=200 mm, cathode voltage $(U_K)=-600$ V, cathode current $(I_K)=1$ A and second coil 17 current $(I_2)=+10$ A.

In FIG. 4, the illustrated characteristics show how it is possible to control the energy and density of particles impinging on substrates 5 in a device according to FIG. 1, by means of varying the multipolar magnetic holding field's shape and intensity. If current $I_2$ is positive and greater than $+2.5$ A, shown by interval A in FIG. 4, lines of force 14 emanating from the edge of cathode 2 extend into the holding space as shown in FIG. 1, and these lines of force are repelled by the field of doubled magnets 11. If the polarity of current $I_2$ is negative or positive but lower than $+1$ A, shown by interval C in FIG. 4, the lines of force 14 at the edge of cathode 2 flow in the other direction, i.e. from the holding space into cathode 2. In this interval, the lines of force from doubled magnets 11 are connected with the lines of force directed from the edge of cathode 2. In interval B, where current $I_2$ ranges from $+1$ A to $+2.5$ A, the field between the edge of cathode 2 and doubled magnets 11 is very low, lower than about 10 mT. The multipolar magnetic holding field is consequently damaged and the plasma's holding is not only weak, but even under low pressure, e.g. 0.1 Pa, glow discharge does not occur at all, for any arbitrary magnitude of current $I_1$ into the first coil 15. A stable discharge under low pressure, e.g. lower than 0.2 Pa, requires consequently that the multipolar magnetic holding field be connected with the cathode's field, either parallel as in interval A or antiparallel as in interval C in FIG. 4.

Curves 42a and 42b show that, in both intervals A and C, it is possible to control the flux density of ions bombarding the substrates with constant voltage $U_S$ on substrates, e.g. $-100$ V. Curves 43a and 43b show that even with zero overall ionization current, $I_s$, it is possible to control the floating potential of the substrates $U_{fl}$, in both intervals A and C. Curves 44a and 44b illustrate that using current $I_1$ of first coil 15, it is possible to hold the discharge voltage and current at constant values, even though the current $I_2$ is widely varying. These curves 44a,b show also that it is necessary for the magnetic fields of coils 15, 17 to oppose each other, regardless of the polarity of current $I_2$.

Curves 44a and 44b are not symmetric with respect to zero current $I_2$, because magnets 11 are doubled and, consequently, even with $I_2=0$ A, the magnetic multipolar holding field is closed by lines of force radiating from magnets 11 to cathode 2.

The characteristics illustrated in FIG. 5 show the possibility of controlling the quantity and energy of particles which impinge on substrates in the device according to FIG. 1 by means of changing the total pressure, $p_T$. Curve 45, the $I_s$ (ionization current) vs. $p_T$ characteristic, shows that high ionization currents (Is) containing 20 to 50% of the cathode current $(I_K)$ can be extracted on substrates 200 mm from cathode 2, with a voltage $U_S$ of only $-100$ V, over a wide pressure range, at least from 0.04 to 5 Pa. The total pressure, $p_T$, also affects the floating potential of the substrates, $U_{fl}$, within a typical range of $-5$ to $-45$ V, as shown in curve 46. Stable discharge was observed down to a pressure of $2 \times 10^{-2}$ Pa.

EXAMPLES

The method of layer sputtering in accordance with the invention is explained below with reference to examples of titanium nitride layers formed in a device represented in FIG. 1.

Example 1

Substrates 5 made of high-speed steel placed on holder 4 were heated to a temperature of 500° C. at a pressure lower than $10^{-2}$ Pa. Voltage $U_S = -600$ V was applied to substrates 5 for 120 sec and a voltage $U_K = -500$ V was applied to cathode 2 at an argon pressure of 0.09 Pa for ion-cleaning the substrates and the cathode. Next, titanium nitride layers were sputtered for 90 minutes in a mixture of argon and nitrogen at a total pressure of 0.09 Pa with a cathode voltage $U_K = -600$ V and cathode current $I_K = 5$ A. Substrates 5 were placed at a distance 200 mm from cathode 2 and a bias $U_S = 100$ V was applied to them. With coil 15 current $I_1 = 0.9$ A and coil 17 current $I_2 = 4$ A, the substrates were bombarded during growth of layers largely by ions from the plasma with total current $I_S = 610$ mA.

A layer prepared as described above had a thickness of 3.2 μm and Vickers microhardness of $HV = 2,590 \pm 90$ kg/mm$^2$, which shows a compact microstructure of the layer as well as a bright gold color.

Titanium nitride layers prepared by conventional magnetron sputtering without the action of a multipolar magnetic holding field where the distance of the substrates from the cathode is 150 mm, at a total pressure of 5 Pa are red, porous and have microhardness of only $HV = 214$ kg/mm$^2$, which is due to the plasma's low density with respect to the substrates and to a low ionization current of $I_S = 20$ mA at the same bias $U_S = -100$ V.

X-ray analysis of titanium nitride layers prepared by the method according to the present invention under the above-mentioned particular conditions gives the following values of the lattice parameters defined by the (111) planes parallel to the surface of the sample: $a_{111} = 0.4299$ nm, from planes (200): $a_{200} = 0.4258$ nm: half-width of lines $\beta_{111} = 0.46°$, $\beta_{200} = 0.56°$, $\beta_{222} = 1.0°$; microstress $e = (7.3 \pm 1.1) \times 10^{-3}$ and macrostress $\delta = 6.4$ GPa. The texture of the coated layer is thick on the (111) plane parallel to the sample's surface. All these values are very near to values attained with titanium nitride layers coated by arc evaporating or low-voltage electron beam evaporating under similar coating conditions. Except for texture, they are also near the values attained during conventional magnetron coating with substantially shorter cathode-substrate separation, typically 50 mm.

Example 2

Titanium nitride layers were prepared in the same process as in Example 1, except that the bias on the substrates was $U_S = -50$ V, with texture (220), while other physical properties of layers did not change considerably in comparison with Example 1.

Example 3

Titanium nitride layers were prepared by the same process as in Example 1, but with source $U_S$ disconnected and with floating potential $U_{fl} = 31$ V with respect to anode 3. The layers had thickness 5.5 μm after a deposition time of 120 min and had a microhardness of $HV = 2,070 \pm 80$ kg/mm$^2$, so that they too are compact. X-ray analysis gives the following results: $a_{111} = 0.4255$ nm, $a_{200} = 0.4243$ nm; $\beta_{111} = 0.23°$, $\beta_{200} = 0.27°$, $\beta_{222} = 0.51°$; $e = (4.0 + 0.5) \times 10^{-3}$, $\delta = 2.9$ GPa. Layers had reduced texture (111)+(200), while relation of corrected reflection intensities $I_{200}/I_{111} = 1$. These properties are unusual compared with titanium nitride coated by other physical methods including conventional sputtering and they show low stresses in the layers and low crystal lattice damage with regard to low energy of bombarding ions and simultaneous bombardment by electrons with sufficient current density. In combination with sufficiently high microhardness, these layers have high adhesion to pads and very useful properties when applied to cutting tools.

Example 4

Example 4 describes control of layer texture by controlling the magnitude of the floating potential, $U_{fl}$. The same process was used as in Example 3, but with current $I_2 = 10$A and $I_1 = 2$A, the floating potential of substrates, $U_{fl}$, was increased to $-45$V and the coated layer had a preferred orientation of (111) with relation $I_{200}/I_{111} = 0.2$. Bias reduction of $U_{fl}$ to $-24$V was attained by changing currents $I_2$ to 3.8 A and $I_1$ to 1.6 A and changing the preferred orientation to (200) with relation $I_{200}/I_{111} = 5$. Other layer parameters, such as microhardness, stress and grid parameters did not change substantially. It is expected that layers with controlled texture are important for optimally coating cutting tools, having a wide variety of applications.

The method in accordance with the invention can also be used for forming titanium nitride decorative gold layers on nonconducting substrates such as glass or porcelain with the process described in Example 1 modified according to Examples 3 and 4 and with the omission of ion-cleaning. Instead of ion-cleaning, it is alternatively possible to perform a sputtering of a titanium layer from 10 to 200 nm thick in an atmosphere of argon without nitrogen for increased layer adhesion. It is possible to advantageously use for this purpose a device in accordance with FIG. 3 where it is possible to coat layers from all directions uniformly at the same time.

The present invention can be modified in several ways. For example, various types and sizes of substrates can be used depending on what material is used as the coated layer and what properties are desired of the layers. It is also possible to use a number of cathode shapes, such as flat, cylindrical, hollow, conical, etc. Further, it is possible to combine various means for controlling the degree of plasma holding, such as changing the magnetic field, using auxiliary electrodes of various shapes and types, and using sliding extension pieces, connected to the anode or an external voltage source. It is also possible to combine all these elements with various means for voltage control on substrates.

In addition, it is possible to accommodate magnets for forming multipolar magnetic field in various modes, such as orienting magnets off the normal to the chamber's wall, but parallel with it. An important modification is selection of the magnets' orientation at the cathode's edge with regard to enclosing magnets in the chamber. This orientation can be both parallel and antiparallel, while the contained plasma has in both cases various parameters, as shown in FIG. 4, curves 42a and 42b, 43a and 43b.

We claim:

1. A method of layer sputtering on substrates with particles sputtered from a cathode surface during glow discharge in a gas or gas mixture under reduced pressure held in a vacuum chamber containing said substrates, an anode and a cathode above which a closed tunnel of magnetron-type magnetic field lines of force is formed, said chamber further including means for defining a plasma containing holding space with the aid of a magnetic field, characterized in that the holding space for the plasma generated and maintained by the glow discharge is formed of an entirely closed space bounded by means for forming magnetic multipolar field lines of force and by said closed tunnel of magnetron-type magnetic field lines of force above said cathode, said substrates being arranged inside the closed holding space, and the anode and the vacuum chamber walls being arranged outside said holding space and separated from said holding space by said magnetic field lines, said glow discharge generating the plasma inside said holding space interacting with said multipolar magnetic field, the direction of which alternates along the boundary of said holding space from positive polarity to negative polarity and vice versa, and the strength of the magnetic field lines diminishing in the direction from the boundary to the inner volume of said holding space, the interaction of the magnetic field and the plasma during said glow discharge between said cathode and said anode causing the plasma to be held within the holding space so that the substrates and layers growing thereon are bombarded by particles in the plasma.

2. A method in accordance with claim 1, characterized in that the degree of plasma holding in the holding space is controlled by changing a parameter of the holding magnetic multipolar field with regard to a reference element, which changes the plasma density proximate to the substrates and the energy of the plasma's charged particles.

3. A method in accordance with claim 2 characterized in that said parameter is selected from the group consisting of the intensity of the holding magnetic multipolar fluid and the form of the holding magnetic multipolar field.

4. A method in accordance with claim 2 characterized in that the reference element is selected from the group consisting of the anode, the walls of the chamber, and the cathode.

5. A method in accordance with claim 1 characterized in that the degree of plasma holding in the holding space is affected by the polarity and intensity of the voltage applied between the anode an an auxiliary electrode extending into the holding space.

6. A method in accordance with claim 1 characterized in that the surface of the substrates is held at a selected potential with regard to the anode.

7. A method in accordance with claim 1, characterized in that the substrates are maintained at a floating potential and owing to a difference between the plasma potential and the floating potential they are bombarded by charged particles, the energy and density of which are controlled by the plasma holding degree, the gas pressure and the sputtering discharge power.

8. A method in accordance with claim 1 characterized in that the layers growing on the substrates are held at a selected potential with regard to the anode.

9. A method in accordance with claim 1 characterized in that the layers growing on the substrates are maintained at a floating potential and owing to a difference between the plasma potential and the floating potential they are bombarded by charged particles, the energy and density of which are controlled by the plasma holding degree, the pressure and the sputtering discharge power.

10. In a device for carrying out layer sputtering onto substrates in a vacuum, said device including a vacuum chamber at least partially enclosing a sputtering source cathode and a substrate holder and including an anode, the vacuum chamber having at least one wall with a working gas inlet and a vacuum pumping outlet, and an externally located source of a plasma striking voltage coupled between the cathode and the anode, and a plurality of magnetic field sources, the improvement wherein the plurality of magnetic field sources is arranged in a pattern to produce an entirely closed plasma containing holding space in which said substrates are located, groups of said magnetic field sources having like poles extending in one direction alternating with adjacent groups having like poles extending in the opposite direction.

11. A device in accordance with claim 16, characterized in that at least some of said plurality of magnetic field sources are located inside said vacuum chamber and others of said plurally of magnetic field sources are located behind said cathode and are arranged in concentric closed curves for forming at least one closed tunnel of magnetic field lines of force above the surface of said cathode.

12. A device in accordance with claim 10 characterized in that said voltage source is connected between said substrate holder and said anode.

13. A device in accordance with claim 10 further including a sliding anode extension piece made of conductive material, electrically connected to said anode.

14. A device in accordance with claim 10 further including at least one auxiliary electrode in said holding space and an externally located direct current-voltage source coupled to said auxiliary electrode and said anode.

15. A device in accordance with claim 10 further including a plurality of cathodes arranged with respect to said vacuum chamber at different angular positions thereof, at least some of said cathodes having mutually facing sputtering surfaces, each of said at least some of said cathodes having a plurality of magnetic field sources located behind the associated sputtering surface and arranged to form a closed tunnel of magnetic field lines of force passing centrally therethrough, opposing ones of said mutually facing cathodes having the same magnetic field polarization.

16. A method of layer sputtering on substrates with particles sputtered from a plurality of cathode surfaces during glow discharge in a gas or gas mixture under reduced pressure held in a vacuum chamber containing said substrates, an anode and a plurality of cathodes above each of which a closed tunnel of magnetron-type magnetic field lines of force is formed, said chamber further including means for defining a plasma containing holding space with the aid of a magnetic field, characterized in that the holding space for the plasma generated and maintained by the glow discharge is formed of an entirely enclosed space bounded by means for forming magnetic multipolar field lines for force and by said closed tunnel of magnetron-type magnetic field lines of force above said plurality of cathodes, at least some of said cathodes having mutually facing sputtering surfaces, said substrates being arranged inside the holding space, and the anode space and separated from said arranged outside said holding space and separated from said holding space by said magnetic field lines, said glow discharge generating the plasma inside said holding space interacting with said multipolar magnetic field, the direction of which alternates along the boundary of said holding space from positive polarity to negative polarity and vice versa, and the strength of the magnetic field lines diminishing in the direction from the boundary to the inner volume of said holding space, the interaction of the magnetic field and the plasma during said glow discharge between said cathodes and said anode causing the plasma to be held within the holding space so that the substrates and layers growing thereon are bombarded by particles in the plasma.

17. In a device for carrying out layer sputtering onto substrates in a vacuum, said device including a vacuum chamber at least partially enclosing a plurality of sputtering source cathodes and a substrate holder and including an anode, the vacuum chamber having at least one wall with a working gas inlet and a vacuum pumping outlet, and an externally located source of a plasma striking voltage coupled between the plurality of cathodes and the anode, and a plurality of magnetic field sources, the improvement wherein the plurality of magnetic field sources is arranged in a pattern to produce an entirely enclosed plasma containing holding space in which said substrates are located and said plurality of sputtering source cathodes includes a plurality of magnetron-type cathodes arranged with respect to said vacuum chamber at different angular positions thereof, at least some of said cathodes having mutually facing sputtering surfaces, groups of said magnetic field sources having like poles extending in one direction alternating with adjacent groups having like poles extending in the opposite direction.

18. A device in accordance with claim 17, wherein each of said magnetron-type cathodes has a plurality of magnetic field sources located behind the associated sputtering surface and arranged to form a closed tunnel of magnetic field lines of force passing centrally therethrough, opposing one of said mutually facing cathodes having the same magnetic field polarization.

19. A method of layer sputtering on substrates with particles sputtered with a plurality of cathode surfaces during glow discharge in a gas or gas mixture under reduced pressure held in a vacuum chamber containing said substrates, an anode and a plurality of cathodes above each of which a closed tunnel of magnetron-type magnetic field lines of force is formed, said chamber further including means for defining a plasma containing holding space with the aid of magnetic field, characterized in that the holding space for the plasma generated and maintained by the glow discharge is bounded by means for forming magnetic multipolar field lines of force and by said closed tunnel of magnetron-type magnetic field lines of force above said plurality of cathodes having mutually facing sputtering surfaces, said substrates being arranges in die the holding space, and the anode and the vacuum chamber walls being arranged outside said holding space and separated from said holding space by said magnetic field lines, said glow discharge generating the plasma inside said holding space interacting with said multipolar magnetic field, the direction of which alternates along the boundary of said holding space from positive polarity to negative polarity and vice versa, and the strength of the magnetic field lines diminishing in the direction from the boundary to the inner volume of said holding space, the interaction of the magnetic field and the plasma during said glow discharge between said cathodes and said anode causing the plasma to be held within the holding space so that the substrates and layers growing thereon are bombarded by particles in the plasma.

20. In a device for carrying out layer sputtering onto substrates in a vacuum, said device including a vacuum chamber at least partially enclosing a plurality of sputtering source cathodes and a substrate holder and including an anode, the vacuum chamber having at lest one wall with a working gas inlet, and a vacuum pumping outlet, and an externally located source of a plasma striking voltage coupled between the plurality of cathodes and the anode, and a plurality magnetic field sources, the improvement wherein the plurality of magnetic field sources is arranged in a pattern to produce a plasma containing holding space in which said substrates are located and said plurality of sputtering source cathodes including a plurality of magnetron-type cathodes arranged with respect to said vacuum chamber at different angular positions thereof, at least one of said cathodes having mutually facing sputtering sources, groups of said magnetic field sources having like poles extending in one direction alternating with adjacent groups having like poles extending in the opposite direction.

21. A device in accordance with claim 20, wherein each of said magnetron-type cathodes has a plurality of magnetic field sources located behind the associated sputtering surface and arranged to form a closed tunnel of magnetic field lines of force passing centrally therethorugh, opposing ones of said mutually facing cathodes having the same magnetic field polarization.

* * * * *